(12) United States Patent
Lee et al.

(10) Patent No.: US 11,852,910 B2
(45) Date of Patent: Dec. 26, 2023

(54) DISPLAY APPARATUS INCLUDING TRANSMISSIVE LIGHT SOURCE

(71) Applicant: LG DISPLAY CO., LTD., Seoul (KR)

(72) Inventors: Junghoon Lee, Incheon (KR); Nam Yong Gong, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/739,519

(22) Filed: May 9, 2022

(65) Prior Publication Data

US 2022/0260871 A1 Aug. 18, 2022

Related U.S. Application Data

(63) Continuation of application No. 16/550,120, filed on Aug. 23, 2019, now Pat. No. 11,353,733.

(30) Foreign Application Priority Data

Dec. 28, 2018 (KR) .......................... 10-2018-0171779

(51) Int. Cl.
*G02F 1/1333* (2006.01)
*H01L 27/12* (2006.01)
(Continued)

(52) U.S. Cl.
CPC ...... *G02F 1/133308* (2013.01); *G02F 1/1368* (2013.01); *G09G 3/3225* (2013.01); *G09G 3/3648* (2013.01); *H01L 27/124* (2013.01); *H10K 59/123* (2023.02); *H10K 59/131* (2023.02)

(58) Field of Classification Search
CPC ............ G02F 1/133308; G02F 1/1368; H01K 59/131; H01K 59/123; G09G 3/3225; H10K 59/131; H10K 59/123
See application file for complete search history.

(56) References Cited

U.S. PATENT DOCUMENTS

2013/0135328 A1  5/2013  Rappoport et al.
2014/0103809 A1*  4/2014  Bang .................. H10K 50/87
                                              315/113
(Continued)

FOREIGN PATENT DOCUMENTS

CN  108234693 A  6/2018
CN  108282558 A  7/2018
(Continued)

OTHER PUBLICATIONS

Chinese Office Action dated Jan. 5, 2023 issued in Patent Application No. 201910767912.4 w/English Translation (22 pages).
(Continued)

*Primary Examiner* — Marc Anthony Armand
(74) *Attorney, Agent, or Firm* — POLSINELLI PC

(57) ABSTRACT

A display apparatus comprises a display panel including a pixel area in which a plurality of pixels is disposed and a peripheral area outside the pixel area; a transmissive light source disposed in a first area of the pixel area; and a timing controller which controls the transmissive light source not to emit light when pixels disposed corresponding to the first area of the pixel area among the plurality of pixels are present in at least one of an image data input period and a pixel light emission period.

20 Claims, 5 Drawing Sheets

(51) Int. Cl.
*G09G 3/36* (2006.01)
*G02F 1/1368* (2006.01)
*G09G 3/3225* (2016.01)
*H10K 59/123* (2023.01)
*H10K 59/131* (2023.01)

(56) References Cited

U.S. PATENT DOCUMENTS

| | | | | |
|---|---|---|---|---|
| 2015/0187304 A1* | 7/2015 | Ko | ......................... | G06F 1/3265 345/94 |
| 2016/0189593 A1* | 6/2016 | Lee | ...................... | G09G 3/3291 438/4 |
| 2019/0096335 A1* | 3/2019 | Kim | ..................... | G09G 3/3275 |
| 2020/0105176 A1* | 4/2020 | Kurokawa | .............. | G02F 1/133 |

FOREIGN PATENT DOCUMENTS

| KR | 10-2018-0081320 A | 7/2018 |
|---|---|---|
| WO | 2018197985 A1 | 11/2018 |

OTHER PUBLICATIONS

Korean Office Action dated Aug. 16, 2023 issued in Patent Application No. 10-2018-0171779 w/English Translation 1 (18 pages).

* cited by examiner

DISPLAY APPARATUS INCLUDING TRANSMISSIVE LIGHT SOURCE

CROSS-REFERENCE TO RELATED APPLICATION

This application is a continuation of U.S. patent application Ser. No. 16/550,120, filed on Aug. 23, 2019, which claims the priority of Korean Patent Application No. 10-2018-0171779, filed on Dec. 28, 2018, which are hereby incorporated by reference in their entirety for all purposes as if fully set forth herein.

BACKGROUND

Field of the Disclosure

The present disclosure relates to a display device, and more particularly, to a display apparatus in which a sensor including a transmissive light source is disposed and more particularly, to a transmissive light source which is disposed on a rear surface of an active area of a display panel.

Description of the Background

In a display apparatus which is used for a monitor of a computer, a TV, a mobile phone, or the like, there are an electroluminescence display apparatus that self-emits light by and a liquid crystal display (LCD) that requires a separate backlight source, etc.

The electroluminescence display apparatus may include an organic light emitting diode, an inorganic light emitting diode, a quantum-dot diode, a Perovskite LED, a micro LED, and the like, as an electroluminescent element.

In recent years, various narrow bezel techniques have been studied in order to reduce the width of a bezel of the electroluminescence display apparatus. Accordingly, a sensor using an infrared light source such as a proximity sensor, an illuminance sensor, and/or a face recognition sensor needs to be disposed in a bezel area. However, there is a limitation in disposing a sensor using an infrared light source due to the narrow bezel width.

SUMMARY

The inventors of the present disclosure have intended to dispose at least one of a proximity sensor, an illuminance sensor and a face recognition sensor using a transmissive light source that transmits a display panel on a rear surface of an area overlapping with an active area of a display panel in order to implement a narrow bezel.

However, the inventors of the present disclosure have recognized that when the transmissive light source is disposed in the active area, the transmissive light source affects the electrical characteristics of semiconductor layers of transistors disposed in a plurality of pixels disposed in the active area.

Therefore, the present disclosure provides a display apparatus capable of minimizing the occurrence of malfunctions of transistors disposed in a plurality of pixels even when a transmissive light source is disposed in an active area of a display panel.

The present disclosure is not limited to the above-mentioned aspects, which are not mentioned above, can be clearly understood by those skilled in the art from the following descriptions.

According to an aspect of the present disclosure, the display apparatus may include: a display panel including a pixel area in which a plurality of pixels is disposed and a peripheral area of the pixel area; a transmissive light source disposed in a first area of the pixel area; and a timing controller which controls the transmissive light source not to emit light when pixels disposed corresponding to the first area of the pixel area among the plurality of pixels are present in at least one period of an image data input period and a pixel light emission period.

According to another aspect of the present disclosure, the display apparatus may include: a display panel including an active area in which a plurality of pixels is disposed and having a light transmitting characteristic; and a transmissive light source disposed on a rear surface of the display panel and configured to supply light emitted through at least a part of the active area, in which the transmissive light source is configured to emit light according to a predetermined turn-on period, and the plurality of pixels disposed corresponding to an area in which the transmissive light source is disposed is configured so that an image data input period and a pixel light emission period are turned off in the turn-on period of the transmissive light source.

According to yet another aspect of the present disclosure, the display apparatus may include: a display panel including an active area in which a plurality of pixels is disposed; a transmissive light source disposed to overlap with the active area; a gate driver configured to apply a first scan signal and a second scan signal to the plurality of pixels; and a timing controller configured to control a period in which the transmissive light source is turned on not to overlap with a period in which the first scan signal and the second scan signal of the gate driver are applied.

According to still another aspect of the present disclosure, the display apparatus may include: a display panel including an active area including a first area in which a plurality of first pixels is disposed and a second area in which a plurality of second pixels is disposed; a transmissive light source disposed corresponding to the first area; a gate driver configured to apply a first scan signal and a second scan signal to the plurality of first pixels and the plurality of second pixels; and a timing controller configured to control turn on or off of the transmissive light source by determining whether the first scan signal and the second scan signal of the gate driver are applied to the plurality of first pixels or to the plurality of second pixels.

Other detailed matters of the exemplary aspects are included in the detailed description and the drawings.

According to the present disclosure, it is possible to suppress occurrence of malfunctions of transistors disposed in a plurality of pixels when a transmissive light source is emitted even though the transmissive light source overlaps with the active area of the display panel.

Further, it is possible to minimize a bezel width of the display apparatus by disposing at least one of a proximity sensor, an illuminance sensor, and a face recognition sensor to overlap with the active area.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE ASPECT

Figure 1:
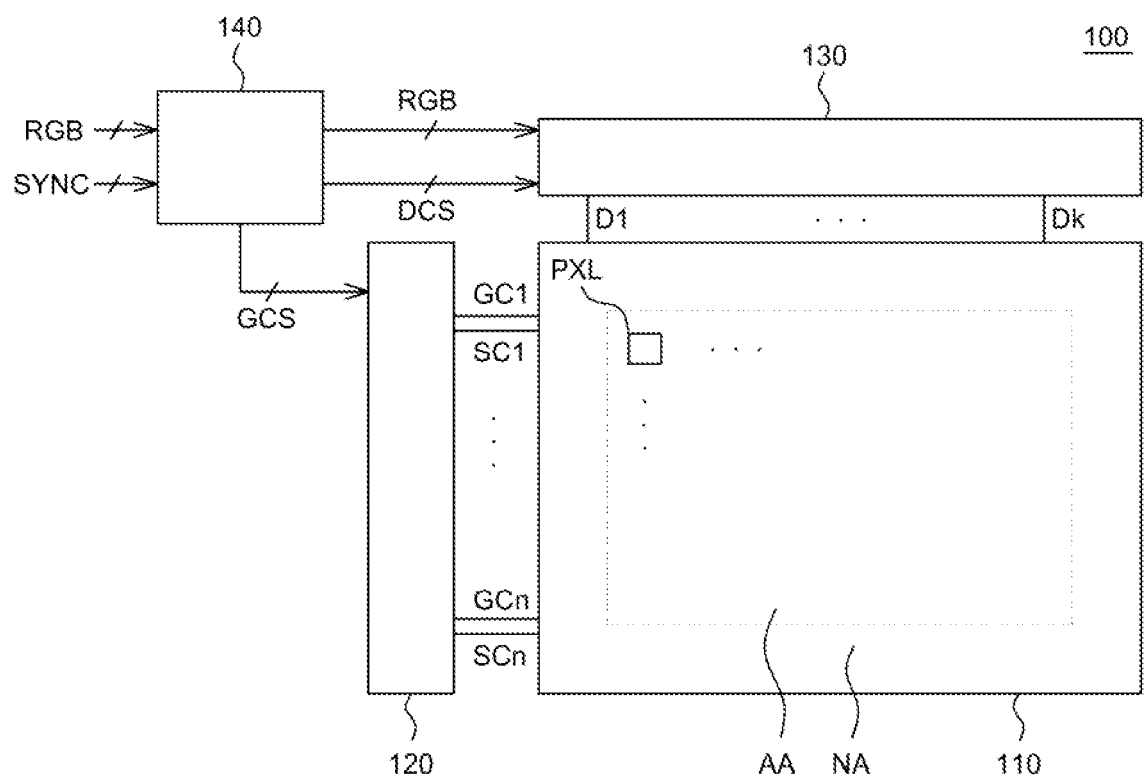
FIG. 1 is a schematic block diagram of a display apparatus according to the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a display apparatus according to exemplary aspects of the present disclosure will be described in detail with reference to accompanying drawings.

More specifically, a display apparatus 100 will be described in more detail with reference to FIGS. 1 to 4 together.

FIG. 1 is a schematic block diagram of a display apparatus according to an exemplary aspect of the present disclosure. Referring to FIG. 1, the display apparatus 100 according to the exemplary aspect of the present disclosure includes a display panel 110, a gate driver 120, a data driver 130, and a timing controller 140.

The display panel 110 includes n first scan lines SC1, . . . , SCn and m second scan lines GC1, . . . , GCm which are disposed in a first direction, k data lines D1, . . . , Dk which are disposed in a different direction from the first direction, and a plurality of pixels PXL which is electrically connected with the n first scan lines SC1, . . . , SCn, the m second scan lines GC1, . . . , GCm, and the k data lines D1, . . . , Dk. The plurality of pixels PXL displays an image by a driving signal or driving voltage applied by the first scan lines SC1, . . . , SCn, the second scan lines GC1, . . . , GCm, and the data lines D1, . . . , Dk.

The display panel 110 includes an active area AA and a non-active area NA adjacent to the active area AA.

A plurality of pixels PXL capable of displaying an image is disposed in the active area AA. Thus, the active area AA may be referred to as a pixel area. A light emitting element of the pixel PXL disposed in the active area AA may be an electroluminescent element. In the exemplary aspect of the present disclosure, it is described on the assumption that the light emitting element of the pixel PXL of the display apparatus 100 is an electroluminescent element, but the present disclosure is not limited thereto. That is, the present disclosure may be applied not only to an electroluminescence display apparatus but also to a quantum dot light emitting display (QLED) apparatus or various other display apparatuses (for example, a liquid crystal display apparatus).

Further, a transmissive light source may be disposed in the active area AA. The transmissive light source may be disposed on the rear surface of the display panel 110 so as to overlap with the active area AA. Thus, the active area AA may include a transmission area that is an area through which light is transmitted by the transmissive light source. At this time, the configurations of the pixels PXL disposed in the transmission area may include transparent materials. The arrangement of the transmissive light source will be described in more detail with reference to FIG. 2.

The non-active area NA may be an area disposed around the active area AA and may be referred to as a peripheral area. More specifically, the non-active area NA may be an area adjacent to the active area AA and surrounding the active area AA. The non-active area NA is an area where no image is displayed, and includes signal lines for transmitting a signal to the pixels PXL disposed in the active area AA and a circuit unit for driving pixels of the active area AA. For example, a gate driver, a data driver, an anti-static element, a signal pad, and a signal link line may be disposed in the non-active area NA.

The timing controller 140 processes properly image data RGB input from the outside according to the size and the resolution of the display panel 110 and supplies the image data RGB to the data driver 130. The timing controller 140 generates a plurality of gate control signals (GCS) and data control signals (DCS) by using synchronizing signals SYNC input from the outside, for example, a dot clock signal DCLK, a data enable signal DE, a horizontal synchronizing signal Hsync, and a vertical synchronizing signal Vsync. The timing controller 140 controls the gate driver 120 and the data driver 130 by supplying the generated gate control signal GCS and the data control signal DCS to the gate driver 120 and the data driver 130, respectively.

The timing controller 140 may control the turn-on and turn-off of the transmissive light source disposed by overlapping with the active area AA. More specifically, the timing controller 140 may control the light so as not to be emitted in the transmissive light source in a period where the turned-on first scan signal, the turned-on second scan signal, and the data signal are input to a plurality of pixels PXL disposed in the transmission area among the plurality of pixels PXL disposed in the active area AA. More specifically, the timing controller 140 controls the transmissive light source disposed in the active area AA to be turned off when the turned-on first scan signal, the turned-on second scan signal, and the data signal are applied to the pixels PXL disposed in the transmission area. On the other hand, the timing controller 140 may control the transmissive light source to be driven similarly to the related art regardless of the turn-on or turn-off of the transmissive light source in an area which does not overlap with the transmissive light source in the active area AA, that is, the active area AA which is not the transmission area. Accordingly, in the display apparatus 100 according to the exemplary aspect of the present disclosure, the transmissive light source is disposed to overlap with the active area AA, thereby minimizing the damage of the pixel PXL due to the light emitted by the transmissive light source even though the transmissive light source is disposed to overlap with the active area AA while reducing the bezel width.

The gate driver 120 supplies the first scan signal and the second scan signal to the n first scan lines SC1, . . . , SCn and the m second scan lines GC1, . . . GCm in accordance with a gate control signal GCS supplied from the timing controller 140. Here, the first scan signal and the second scan signal may be referred to as one gate signal.

The data driver 130 converts the image data RGB into a data voltage according to a data control signal DCS supplied from the timing controller 140 and supplies the converted data voltage to the pixel PXL through the k data lines D1, . . . , Dk.

The display panel 110 in which the transmissive light source is disposed in the display apparatus 100 configured above will be described in more detail with reference to FIG. 2.

Figure 2A:
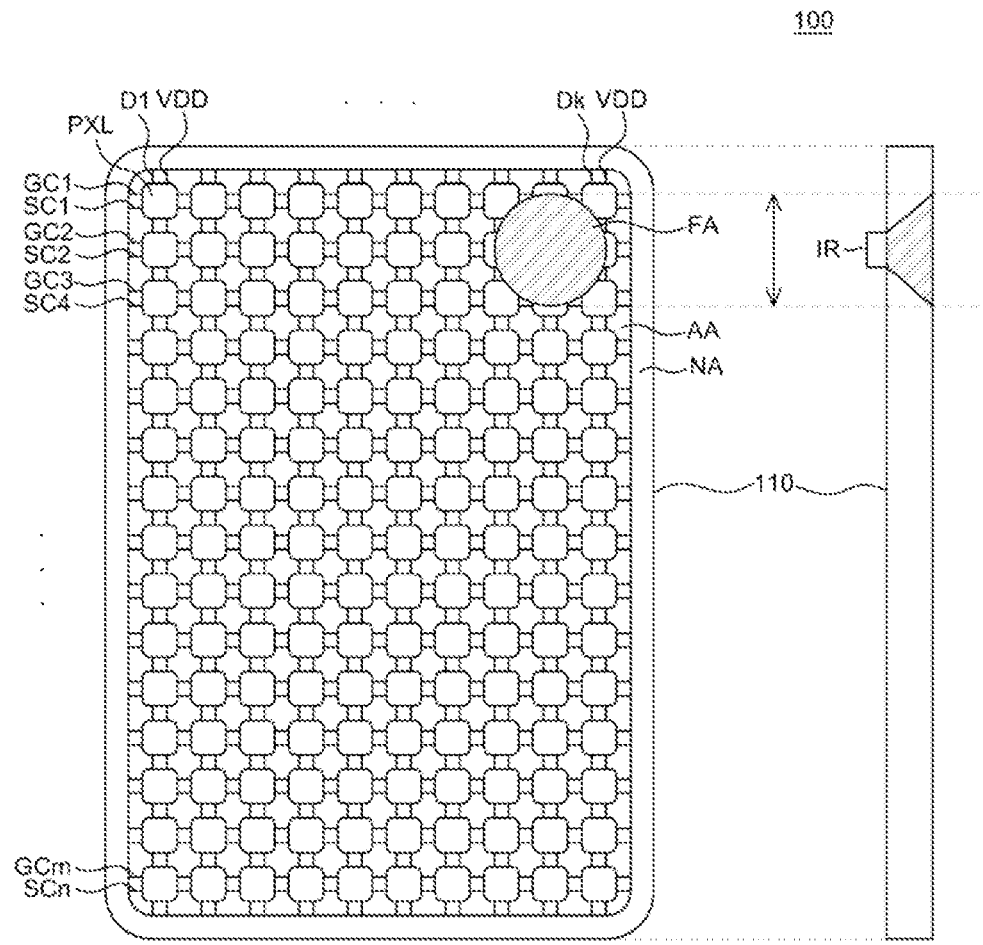
FIG. 2A is a schematic plan view of a display panel of FIG. 1
Figure 2B:
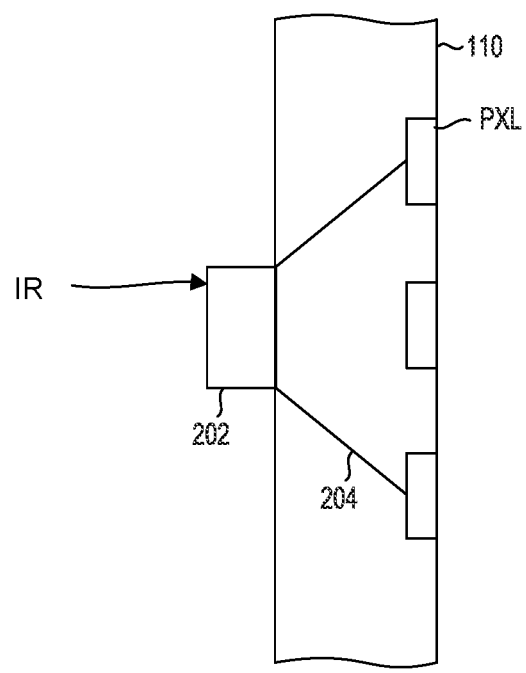
FIG. 2B is a cross section illustrating a transmissive light source.

FIG. 2A is a schematic plan view of a display panel of FIG. 1 and FIG. 2B is a cross section illustrating a transmissive light source.

Referring to FIG. 2A, a transmissive light source IR is disposed on the rear surface of the display panel 110 according to the exemplary aspect of the present disclosure. The rear surface of the display panel 110 means the rear surface of a display surface on which the image is displayed. That is, since the image of the display apparatus 100 is displayed on the front surface of the display panel 110, that is, on the display surface, the rear surface is a surface on which the image is not displayed, that is, a surface opposite to the display surface.

The transmissive light source IR outputs light of a specific wavelength from the rear surface of the display panel 110 to the display surface of the display panel 110. The output light may be transmitted through the display panel 110. The transmissive light source IR may be a light source configured to have a wavelength of one of visible light, ultraviolet light, and infrared light. The transmissive light source IR may be an infrared light source. The transmissive light source IR may be configured by a light emitting diode (LED). However, the present disclosure is not limited thereto.

The transmissive light source IR is light that may be transmitted through the display panel 110, and the display panel 110 is configured to provide a predetermined transmission area. For example, a space between a pixel and a pixel is configured to have transparency, so that transmissive light may be transmitted through the display panel. For example, a bank surrounding each pixel may be formed between the pixel and the pixel. Thus, the bank may be made of a material having transparency.

At least one of the transmissive light sources IR may be disposed on the rear surface of the display panel 110. The transmissive light source IR includes a light component 202 (e.g., an IR light source, a light sensor) for generating or receiving light on a rear surface using a bank 204 having a transparent structure for passing the light through the display panel 110. An area through which the light emitted by the transmissive light source IR is transmitted in the area of the display panel 110 may be defined as a transmission area FA. Since the light output from the transmissive light source IR may be transmitted through the display panel 110, the light may be supplied to the display surface of the display panel 110. Since the transmissive light source IR overlaps with the active area AA, the width of the non-active area NA, particularly, the bezel, may not be increased. Therefore, even if the transmissive light source IR is further disposed on the display panel 110, the width of the bezel may not be increased. The transmissive light source IR may be a light source constituting a proximity sensor, an illuminance sensor, and a face recognition sensor. That is, at least one of the above-described sensors may be disposed on the rear surface of the active area AA of the display panel 110. However, since the exemplary aspect of the present disclosure has the characteristic to solve the problem caused by the correlation between the transmissive light source IR and the pixel PXL, hereinafter, detailed description of the operation of the sensors will be omitted, and the correlation between the transmissive light source IR included in the sensor and the pixel PXL will be described in detail.

The display panel 110 is a panel in which an image is implemented, and pixels PXL for implementing an image and circuits, lines, and components for driving the pixels PXL may be disposed in the display panel 110.

The display panel 110 is configured to include an active area AA and a non-active area NA. A plurality of pixels PXL is disposed in the active area AA as an area in which the image is displayed. In the active area AA, pixels PXL for displaying an image and a circuit unit for driving the pixels PXL may be disposed. For example, when the display apparatus 100 is an electroluminescent display apparatus, the pixel PXL may include an electroluminescent element. Hereinafter, for convenience of explanation, it is assumed that the display apparatus according to various exemplary aspects of the present disclosure is a display apparatus 100 including an electroluminescent element, but the present disclosure is not limited thereto. The plurality of pixels PXL may be arranged in a matrix form.

The pixels PXL may include a red pixel, a green pixel, and a blue pixel, or may include a white pixel, a red pixel, a green pixel, and a blue pixel.

The non-active area NA is an area in which no image is displayed, and is an area in which circuits, lines, and components for driving pixels in the active area AA are disposed. Various ICs and driving circuits, such as a gate driver and a data driver, may be disposed in the non-active area NA. For example, various ICs and driving circuits may be mounted in the non-active area NA of the display panel 110 by a gate in panel (GIP) method or connected with the display panel 110 by a tape carrier package (TCP) or chip on film (COF) method.

Each of the plurality of pixels PXL or one pixel PXL disposed in the active area AA may be connected with the first scan signal lines SC1, . . . , SCn, the second scan signal lines CG1, . . . , GCm, the data lines D1, . . . , Dk, and a high potential power supply line VDD.

The first scan signal lines SC1, . . . , SCn may be configured to have n lines, which are signal lines for providing a first scan signal to each of the plurality of pixels PXL. Here, n is a natural number of 1 or greater.

The second scan signal lines GC1, . . . , GCm may be configured to have m lines, which are signal lines for providing a second scan signal to each of the plurality of pixels PXL. Here, m is a natural number of 1 or greater.

The data lines D1, . . . , Dk may be configured to have k lines, which are signal lines for providing a data signal to each of the plurality of pixels PXL. Here, k is a natural number of 1 or greater.

The number of the first scan signal lines SC1, . . . , SCn and the number of the second scan signal lines GC1, . . . , GCm may be the same as each other. However, it is not limited thereto, but the number of the first scan signal lines SC1, . . . , SCn and the number of the second scan signal lines GC1, . . . , GCm may be different from each other. For example, a specific signal line may further include a dummy signal line as needed at the end of the active area AA.

Figure 3:
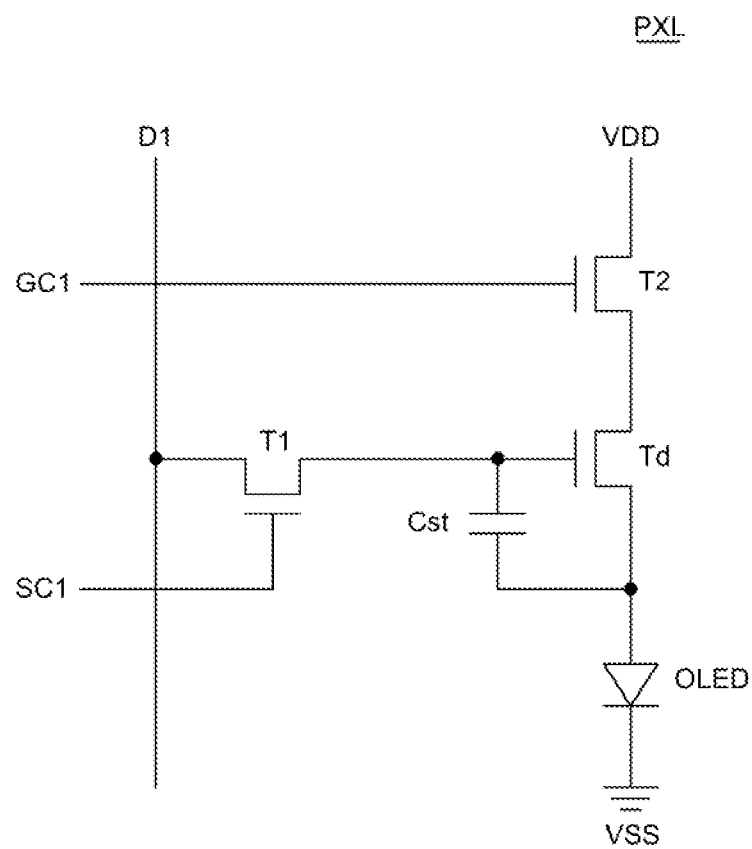
FIG. 3 is an exemplary circuit view of a pixel of FIG. 2.
Figure 4:
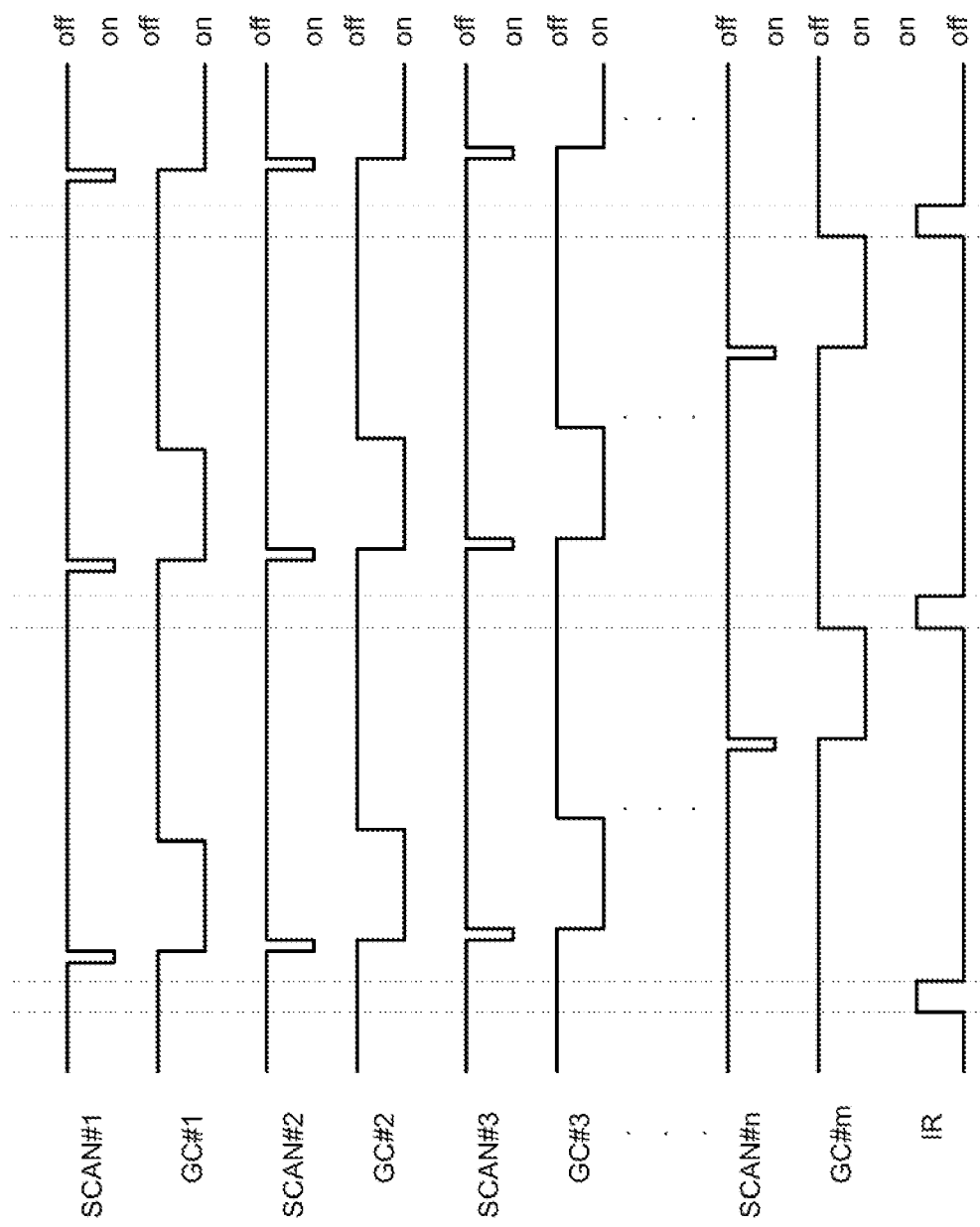
FIG. 4 is a waveform diagram of a display apparatus according to the present disclosure.

FIG. 3 is an exemplary circuit view of pixels of FIG. 2. FIG. 4 is a waveform diagram of a display apparatus according to an exemplary aspect of the present disclosure.

Referring to FIG. 3, an exemplary pixel PXL may be configured to include a light emitting element OLED for displaying an image, transistors T1, T2, and Td, and a capacitor Cst. More specifically, the pixel PXL may include a driving transistor Td, a first transistor T1, a second transistor T2, a storage capacitor Cst, and an electroluminescent element OLED. However, the structure of the pixel PXL according to the exemplary aspect of the present disclosure is merely an example, and the present disclosure is not limited thereto. In addition, the exemplary aspects according to the present disclosure may be modified by applying various pixel structures known to those skilled in the art.

The exemplary pixel PLX may be connected to the first scan signal lines SC1, . . . , SCn, the second scan signal lines CG1, GCm, the data lines D1, . . . , Dk, and the high potential power supply line VDD. Hereinafter, an upper left pixel PXL of the active area AA illustrated in FIG. 1 will be described as an example.

The electroluminescent element OLED of the pixel PXL is illustratively shown as an organic light emitting diode, but the present disclosure is not limited thereto and may be implemented with various light emitting elements. The electroluminescent element OLED may include an anode electrode connected to the driving transistor Td, a light emitting layer formed on the anode electrode, and a cathode electrode formed on the light emitting layer. The cathode electrode may be referred to as a low potential voltage electrode VSS.

The gate electrode of the first transistor T1 of the pixel PXL may be electrically connected to the first scan line SC1. In addition, one side of a channel of the first transistor T1 may be electrically connected to the data line D1. In addition, the other side of the channel of the first transistor T1 may be electrically connected to the gate electrode of the driving transistor Td.

Referring to FIGS. 3 and 4, the first transistor T1 may be turned on or off by a first scan signal SCAN #1 applied through the first scan line SC1. In addition, when the first transistor T1 is turned on, image data applied through the data line D1 may be input to the driving transistor Td. The first scan signal SCAN #1 may be supplied through a gate driver (not illustrated) that may be disposed in the non-active area NA of the display panel 110. However, the arrangement position of the gate driver may be disposed on a separate printed circuit board instead of the non-active area NA. The gate driver may be configured to include a plurality of shift registers. The gate driver may be connected to the first scan lines SC1, . . . , SCn and the second scan lines GC1, GCm.

That is, the first transistor T1 means a transistor configured to perform a function of inputting image data to the driving transistor Td. More specifically, the first transistor T1 may be a switching transistor.

The gate electrode of the driving transistor Td may be connected to the first transistor T1 and one side of the channel of the driving transistor Td may be connected to the electroluminescence element OLED. The other side of the channel of the driving transistor Td may be electrically connected to the high potential voltage line VDD.

The storage capacitor Cst may be disposed between the gate electrode of the driving transistor Td and the anode electrode of the electroluminescent element OLED. In addition, the image data input when the first transistor T1 is turned on is stored in one electrode of the storage capacitor Cst in a floating state while the first scan signal SCAN #1 is turned off. The amount of current supplied from the driving transistor Td to the electroluminescent element OLED may be determined according to the stored image data.

That is, the driving transistor Td means a transistor configured to perform a function of supplying a current amount corresponding to the image data stored in the storage capacitor Cst to the electroluminescence element OLED.

The gate electrode of the second transistor T2 may be electrically connected to the second scan line GC1. In addition, one side of a channel of the second transistor T2 may be electrically connected to the high potential voltage line VDD. In addition, the other side of the channel of the second transistor T2 may be electrically connected to the other side of the channel of the driving transistor Td.

The second transistor T2 may be turned on or off by a second scan signal GC #1 applied to the second scan line GC1. In addition, when the second transistor T2 is turned on, a high potential voltage may be supplied to the driving transistor Td through the high potential voltage line VDD. The second scan signal GC #1 may be supplied through the gate driver that may be disposed in the non-active area NA of the display panel 110. The gate driver may be configured to include a plurality of shift registers.

The second transistor T2 may be turned on by the first transistor T1 after the image data is stored in the storage capacitor Cst. In addition, in a state in which the second transistor T2 is turned on, the electroluminescent element OLED may display the brightness corresponding to the image data.

That is, the second transistor T2 means a transistor configured to perform a function of switching a high potential voltage supply to the driving transistor Td. As a result, the second transistor T2 performs a function of turning on or off the electroluminescent element OLED by switching the high potential voltage line VDD. A turn-on period of the electroluminescent element OLED may be adjusted according to the turn-on duty of the second scan signal GC #1.

When a first scan signal SCAN #1 of the turn-on voltage is supplied through a first scan line SC1 disposed in a first row of the display panel 110, the first transistor T1 of the pixels PXL connected to the first scan line SC1 is turned on. That is, the pixels PXL corresponding to the first pixel row are turned on and the image data may be input to the pixels PXL in the first pixel row through the data lines D1, ..., Dk during the turn-on period. The image data may be supplied through the data driver which may be disposed in the non-active area NA. However, the arrangement position of the data driver may be disposed on the non-active area NA, but it is not limited thereto and may be disposed on a separate printed circuit board. The data driver may be configured to include a digital to analogue converter (DAC) that converts digital image data into an analog voltage. The data driver may be connected to the data lines D1, ..., Dk.

In addition, when a first scan signal SCAN #2 of the turn-on voltage is sequentially supplied through a first scan line SC2 disposed in a second row adjacent to the first row of the display panel 110, the first transistor T1 of the pixels PXL connected to the next first scan line SC2 is turned on. That is, the pixels PXL corresponding to the second pixel row are turned on and the image data may be input to the pixels PXL in the second pixel row through the data lines D1, ..., Dk during the turn-on period.

In addition, when a first scan signal SCAN #3 of the turn-on voltage is sequentially supplied through a first scan line SC3 disposed in a third row adjacent to the second row of the display panel 110, the first transistor T1 of the pixels PXL connected to the next first scan line SC3 is turned on. That is, the pixels PXL corresponding to the third pixel row are turned on and the image data may be input to the pixels PXL in the third pixel row through the data lines D1, ..., Dk during the turn-on period.

As such, the first scan signals SCAN #1, SCAN #n are sequentially transferred from the first scan line SC1 of the first row of the display panel 110 to the first scan line SCn of the last nth row. That is, the pixels PXL of each pixel row may be configured to sequentially receive the image data.

The above-described operation may be sequentially applied to the remaining pixel rows. Accordingly, the image data may be input to the pixel area AA of the display apparatus 100.

When the transmissive light source IR is transmitted through the transmission area FA through which the transmissive light source IR is transmitted, the channels of the pixels PXL corresponding to the corresponding area may be influenced by the transmissive light source.

For example, when light is supplied to the first transistor T1, the electrical characteristics of the channel of the first transistor T1 may be varied and the turned-off first transistor T1 may be turned on. Therefore, erroneous image data may be input to the pixel PXL.

For example, when light is supplied to the second transistor T2, the electrical characteristics of the channel of the second transistor T2 may be varied and the turned-off second transistor T2 may be turned on. Thus, the turned-off electroluminescent element OLED may be turned on.

For example, when light is supplied to the driving transistor Td, the electrical characteristics of the channel of the driving transistor Td may be varied, and the amount of current supplied to the electroluminescent element OLED may be different from the image data. Therefore, the quality of the image may be deteriorated. In other words, a semiconductor layer of each transistor may be formed of a silicon semiconductor and/or an oxide semiconductor layer. When light is supplied to the semiconductor layer by a photoelectric effect of the semiconductor layer, a leakage current may be generated through the semiconductor layer. However, the present disclosure is not limited to the material of the semiconductor layer, and various semiconductor layer materials having the photoelectric effect may be applied. The amount of leakage current may be proportional to the amount of light. Therefore, the transistors exposed to the transmissive light source IR may malfunction. That is, the pixels PXL overlapping with the transmission area FA may malfunction when the transmissive light source IR is turned on, thereby lowering the reliability of the display apparatus.

The display apparatus 100 according to the exemplary aspect of the present disclosure may be configured to include a display panel 110 including a pixel area AA in which pixels PXL arranged in a matrix are disposed and a peripheral area NA, and a transmissive light source IR configured to supply light that is transmitted through the transmission area FA of the active area AA. In addition, an image data input period of the pixel area AA corresponding to the transmission area FA, that is, a period where the first scan signal is turned on and a pixel light emission period, that is, a period where the second scan signal is turned on may be set not to overlap with a period where the transmissive light source IR is turned on.

According to the above-described configuration, even if the transmissive light source IR is turned on, the pixels PXL of the transmission area FA are not affected by the light of the transmissive light source IR. Therefore, even if the active area AA of the display panel 110 overlaps with the transmissive light source IR, the image quality of the display apparatus 100 may not be deteriorated and the width of the bezel may be reduced.

Since the plurality of pixels PXL of the active area AA other than the transmission area FA is not affected by the transmissive light source IR even through the transmissive light source IR is turned on during the image data input period and the pixel light emission period, the turn-on period of the transmissive light source IR may overlap with at least a part of the image data input period and/or the pixel light emission period.

According to the above-described configuration, the plurality of pixels PXL of the active area AA other than the transmission area FA may set the image data input period and the pixel light emission period irrespective of the turn-on period of the transmissive light source IR.

In some exemplary aspects, the pixel PXL may be configured to further include an initialization circuit, a threshold voltage compensation circuit, and the like.

The initialization means a step of initializing the image data stored in the storage capacitor connected to the driving transistor for inputting new image data. The initialization period of the pixel PXL corresponding to the transmission area FA may be set to non-overlap with the turn-on period of the transmissive light source IR.

The threshold voltage compensation means a step of compensating for the threshold voltage deviation of the driving transistor Td for each pixel to improve the image quality. The threshold voltage compensation period of the pixel PXL corresponding to the transmission area FA may be set to non-overlap with the turn-on period of the transmissive light source IR.

For example, one pixel may operate in the order of the initialization period, the threshold voltage compensation period, the image data input period, and the pixel light emission period. However, the present disclosure is not limited thereto.

According to the above-described configuration, even if the initialization period and the threshold voltage compensation period are added, the initialization period and the threshold voltage compensation period of the pixel PXL corresponding to the transmission area FA are set to non-overlap with the turn-on period of the transmissive light source IR, so that there is an effect that the quality of the image may not be deteriorated.

In some exemplary aspects, various functional members may be disposed between the display panel 110 and the transmissive light source IR.

For example, a back plate may be disposed. When a substrate including the display panel 110 is made of a plastic material such as polyimide (PI), a manufacturing process of the display apparatus is performed in a state that a support substrate made of glass is disposed below the substrate and after the display panel 110 is formed, the support substrate may be released. The support substrate may be a glass substrate. However, since a component for supporting the substrate is required after the support substrate is released, a back plate for supporting the substrate may be disposed below the substrate. Further, the back plate may protect the display panel 110 from external moisture, heat, impact, and the like.

For example, a heat dissipation plate may be disposed on the rear surface of the back plate. The heat dissipation plate may emit the heat of the display panel 110 to improve the lifespan and reliability of the display panel 110.

For example, a touch panel may be further disposed on the display panel 110. The touch panel is a device for sensing a touch input of a user such as a screen touch or a gesture on the display apparatus 100, and the touch panel may use a resistive film type, a capacitive type, an optical type, or an electromagnetic type.

A display apparatus according to various exemplary aspects of the present disclosure may be described as follows.

According to an aspect of the present disclosure, there is provided a display apparatus. The display apparatus comprising the display panel including a pixel area in which a plurality of pixels is disposed and a peripheral area of the pixel area; a transmissive light source disposed in a first area of the pixel area; and a timing controller which controls the transmissive light source not to emit light when pixels disposed corresponding to the first area of the pixel area among the plurality of pixels are present in at least one period of an image data input period and a pixel light emission period.

The timing controller may be controlled the image data input period and the pixel light emission period of at least some of the plurality of pixels disposed corresponding to a second area which is an area except for the first area in the pixel area to overlap with a light emission period of the transmissive light source.

The second area may be an area through which the light emitted by the transmissive light source is transmitted.

Each of the plurality of pixels may include an electroluminescent element that emits light for displaying an image, a first transistor for switching supply of image data, a driving transistor configured to supply a predetermined current corresponding to the supplied image data to the electroluminescent element, and a second transistor for switching supply of a high potential voltage supplied to the driving transistor.

At least one of the first transistor, the second transistor, and the driving transistor may be configured to include a semiconductor material whose electrical characteristics are varied by the light emitted by the transmissive light source.

The display panel may include a first scan line configured to switch the first transistor, a data line configured to supply the image data to the driving transistor through the first transistor, a second scan line configured to switch the second transistor, and a high-potential power supply line electrically connected to the second transistor, which are electrically connected with the one pixel.

The image data input period may be a period where the first scan line is turned on and the image data is applied to a gate electrode of the driving transistor, and the pixel light emission period is a period where the second scan line is turned on, the second transistor is turned on, and the electroluminescent element emits the light by the current supplied through the drive transistor.

The pixels disposed in the first area among the plurality of pixels may include a transparent material so that the light emitted by the transmissive light source is transmitted.

According to another aspect of the present disclosure, there is provided a display apparatus. The display apparatus comprising: a display panel including an active area in which a plurality of pixels is disposed and having a light transmitting characteristic; and a transmissive light source disposed on a rear surface of the display panel and configured to supply light emitted through at least a part of the active area, in which the transmissive light source is configured to emit light according to a predetermined turn-on period, and the plurality of pixels disposed corresponding to an area in which the transmissive light source is disposed is configured so that an image data input period and a pixel light emission period are turned off in the turn-on period of the transmissive light source.

The display apparatus may include at least one of a proximity sensor, an illuminance sensor, and a face recognition sensor configured to include the transmissive light source.

The display panel may be configured so that a space between one pixel of the plurality of pixels and the other pixel disposed adjacent to the one pixel has transparency and configured so that the transmissive light source is transmitted through the display panel.

The transmissive light source may be an infrared light source.

Each of the plurality of pixels may include a first transistor, a second transistor, a driving transistor, an electroluminescent element, and a storage capacitor, the first transistor is configured to perform an image data input function to the driving transistor, the driving transistor is configured to perform a function of supplying a current amount corresponding to image data stored in the storage capacitor to a current light emitting element, and the second transistor is configured to perform a function of adjusting a turn-on period of the electroluminescent element.

According to yet another aspect of the present disclosure, there is provided a display apparatus. The display apparatus comprising: a display panel including an active area in which a plurality of pixels is disposed; a transmissive light source disposed to overlap with the active area; a gate driver configured to apply a first scan signal and a second scan signal to the plurality of pixels; and a timing controller configured to control a period in which the transmissive light source is turned on not to overlap with a period in which the first scan signal and the second scan signal of the gate driver are applied.

The pixels to which the first scan signal and the second scan signal of the gate driver may be applied among the plurality of pixels are pixels disposed in an area disposed to overlap with the transmissive light source.

The first scan signal may be a signal for controlling image data to be input to the pixel, and the second scan signal is a signal for controlling a high potential voltage to be applied to a light emitting element formed in the pixel.

The transmissive light source may be disposed on a rear surface of the display panel.

According to still another aspect of the present disclosure, there is provided a display apparatus. The display apparatus comprising: a display panel including an active area including a first area in which a plurality of first pixels is disposed and a second area in which a plurality of second pixels is disposed; a transmissive light source disposed corresponding to the first area; a gate driver configured to apply a first scan signal and a second scan signal to the plurality of first pixels and the plurality of second pixels; and a timing controller configured to control turn on or off of the transmissive light source by determining whether the first scan signal and the second scan signal of the gate driver are applied to the plurality of first pixels or to the plurality of second pixels.

The timing controller may be controlled the transmissive light source to be turned off when at least one of the first scan signal and the second scan signal is applied to the plurality of first pixels.

The timing controller may be controlled the transmissive light source to be turned on when the first scan signal and the second scan signal are applied to the plurality of second pixels.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display apparatus comprising:
a flexible substrate including a pixel area and a peripheral area outside the pixel area;
a plurality of pixels disposed on the pixel area including a first area and a second area which is an area except for the first area;
a light source disposed on a rear surface of the flexible substrate in the first area; and
a data line, a first scan line, a second scan line and a high potential power supply line which are electrically connected to each of the plurality of pixels,
wherein at least one of the data line, the first scan line, the second scan line and the high potential power supply line overlaps with the first area.

2. The display apparatus of claim 1, wherein each of the plurality of pixels comprises:
an electroluminescent element that emits light for displaying an image;
a driving transistor connected to the electroluminescent element and configured to supply a predetermined current corresponding to image data supplied to the electroluminescent element;
a first transistor including a gate electrode connected to the first scan line, one side of a channel thereof connected to the data line and the other side of the channel thereof connected to the driving transistor;
a second transistor including a gate electrode connected to the second scan line, one side of a channel thereof connected to the high potential power supply line and the other side of the channel thereof connected to the driving transistor; and
a storage capacitor disposed between a gate electrode of the driving transistor and an anode electrode of the electroluminescent element.

3. The display apparatus of claim 1, further comprising:
a back plate for supporting the flexible substrate disposed below the flexible substrate.

4. The display apparatus of claim 3, further comprising:
a heat dissipation plate disposed on a rear surface of the back plate.

5. The display apparatus of claim 1, further comprising:
a touch panel disposed on the flexible substrate for sensing a touch input of a user.

6. The display apparatus of claim 1,
wherein pixels disposed in the first area among the plurality of pixels include a transparent material so that light emitted by the light source is transmitted.

7. The display apparatus of claim 1, further comprising:
a bank surrounding each of the pixels disposed in the first area among the plurality of pixels made of a material having transparency.

8. The display apparatus of claim 1, further comprising:
a dummy signal line disposed at an end of the pixel area.

9. The display apparatus of claim 1, further comprising:
a gate driver connected to the first scan line and the second scan line and disposed in the peripheral area.

10. The display apparatus of claim 1, further comprising:
a timing controller which controls the light source and the plurality of pixels.

11. The display apparatus of claim 10,
wherein the timing controller controls an image data input period and a pixel light emission period of a plurality of pixels disposed in the first area not to overlap with a light emission period of the light source, and
wherein the timing controller controls an image data input period and a pixel light emission period of a plurality of pixels disposed in the second area to overlap with the light emission period of the light source.

12. The display apparatus of claim 11,
wherein the image data input period includes a period where the first scan line is turned on and image data is applied to a gate electrode of a driving transistor, and
wherein the pixel light emission period includes a period where the second scan line is turned on, a second transistor is turned on, and an electroluminescent element emits light by the current supplied through the driving transistor.

13. A display apparatus comprising:
a flexible substrate including a pixel area and a peripheral area outside the pixel area;
a light source disposed on a rear surface of the flexible substrate;

a plurality of pixels disposed on the pixel area including a first area corresponding to a location of the light source and a second area which is an area except for the first area and wherein pixels disposed in the first area among the plurality of pixels include a transparent material so that light emitted by the light source is transmitted through the flexible substrate.

14. The display apparatus of claim 13, further comprising: a space between one pixel of the plurality of pixels and another pixel disposed adjacent to the one pixel in the first area has transparency.

15. The display apparatus of claim 13, wherein the second area is an area through which light is not emitted by the light source.

16. The display apparatus of claim 13, wherein each of the plurality of pixels further comprises:
   a first transistor for switching supply of image data;
   a driving transistor configured to supply a predetermined current corresponding to the image data to an electroluminescent element; and
   a second transistor for switching supply of a high potential voltage supplied to the driving transistor.

17. The display apparatus of claim 16, wherein at least one of the first transistor, the second transistor, and the driving transistor includes a semiconductor material having electrical characteristics varied by the light emitted by the light source.

18. The display apparatus of claim 13,
   wherein the light source is configured to emit light according to a predetermined turn-on period, and
   where the plurality of pixels disposed in the first area are configured so that an image data input period and a pixel light emission period are turned off in the predetermined turn-on period of the light source.

19. The display apparatus of claim 13,
   wherein the display apparatus includes at least one of a proximity sensor, an illuminance sensor, and a face recognition sensor configured to include the light source.

20. The display apparatus of claim 1, wherein the light source is configured to emit a direction of light emitted by the plurality of pixels though the flexible substrate.

* * * * *